(12) United States Patent
Lavoie et al.

(10) Patent No.: US 7,682,891 B2
(45) Date of Patent: Mar. 23, 2010

(54) TUNABLE GATE ELECTRODE WORK FUNCTION MATERIAL FOR TRANSISTOR APPLICATIONS

(75) Inventors: Adrien R. Lavoie, Beaverton, OR (US); Valery M. Dubin, Portland, OR (US); John J. Plombon, Portland, OR (US); Juan E. Dominguez, Hillsboro, OR (US); Harsono S. Simka, Saratoga, CA (US); Joseph H. Han, San Jose, CA (US); Mark Doczy, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 316 days.

(21) Appl. No.: 11/647,893

(22) Filed: Dec. 28, 2006

(65) Prior Publication Data

US 2008/0157212 A1    Jul. 3, 2008

(51) Int. Cl.
*H01L 29/78* (2006.01)
(52) U.S. Cl. .............................. 438/199; 257/E29.255; 257/E29.264
(58) Field of Classification Search ................ 257/288, 257/E29.264, E29.255; 438/199
See application file for complete search history.

(56) References Cited

U.S. PATENT DOCUMENTS

| | | | | |
|---|---|---|---|---|
| 6,291,282 B1 * | 9/2001 | Wilk et al. | ................... | 438/203 |
| 6,476,454 B2 * | 11/2002 | Suguro | ........................ | 257/410 |
| 6,743,473 B1 * | 6/2004 | Parkhe et al. | ................ | 427/252 |
| 2005/0280050 A1 | 12/2005 | Doczy et al. | | |
| 2006/0081939 A1 * | 4/2006 | Akasaka et al. | .............. | 257/371 |
| 2007/0037335 A1 * | 2/2007 | Chambers et al. | ........... | 438/197 |
| 2007/0054046 A1 * | 3/2007 | Ishizaka et al. | .......... | 427/248.1 |

OTHER PUBLICATIONS

Adrien Lavoie et al., Amine-Free Deposition of Metal-Nitride Films, U.S. Appl. No. 11/240,005, filed Sep. 30, 2005, 28 pg.
Juan E. Dominguez et al., "Direct Tailoring of the Composition and Density of ALD Films", U.S. Appl. No. 11/266,131, filed Nov. 2, 2005, 26 pg.
Juan E. Dominguez et al., "Using Unstable Nitrides to Form Semiconductor Structures", U.S. Appl. No. 11/359,060, filed Feb. 22, 2006, 16 pg.
Willy Rachmady et al., "Highly-Selective Metal Etchants", U.S. Appl. No. 11/501,379, filed Aug. 8, 2006, 42 pg.

(Continued)

*Primary Examiner*—Matthew Smith
*Assistant Examiner*—Michele Fan
(74) *Attorney, Agent, or Firm*—Blakely, Sokoloff, Taylor & Zafman LLP (57) ABSTRACT

Described herein are metal gate electrode stacks including a low resistance metal cap in contact with a metal carbonitride diffusion barrier layer, wherein the metal carbonitride diffusion barrier layer is tuned to a particular work function to also serve as a work function metal for a pMOS transistor. In an embodiment, the work function-tuned metal carbonitride diffusion barrier prohibits a low resistance metal cap layer of the gate electrode stack from migrating into the MOS junction. In a further embodiment of the present invention, the work function of the metal carbonitride barrier film is modulated to be p-type with a pre-selected work function by altering a nitrogen concentration in the film.

20 Claims, 7 Drawing Sheets

OTHER PUBLICATIONS

Y.T. Hou et al., "High Performance Tantalum Carbide Metal Gate Stacks for nMOSFET Application", IEDM Tech. Dig., 2005, 4 pg.

J.K. Schaeffer et al., "Challenges for the Integration of Metal Gate Electrodes", IEDM Tech. Dig., 2004, 4 pg.

H.-H. Tseng et al., Improved Short Channel Device Characteristics With Stress Relieved Pre-Oxide (SRPO) And a Novel Tantalum Carbon Alloy Metal Gate/HfO2 Stack, IEDM Tech. Dig., 2004, 4 pg.

* cited by examiner

TUNABLE GATE ELECTRODE WORK FUNCTION MATERIAL FOR TRANSISTOR APPLICATIONS

BACKGROUND OF THE INVENTION

1. Field of the Invention

The present invention relates to semiconductor device manufacture. More particularly this invention relates to transistor gate electrode materials.

2. Discussion of Related Art

During the past two decades, the physical dimensions of MOSFETs have been aggressively scaled for low-power, high-performance CMOS applications. In order to continue scaling future generations of CMOS, the use of metal gate electrode technology is important. For example, further gate insulator scaling will require the use of dielectric materials with a higher dielectric constant than silicon dioxide. Devices utilizing such gate insulator materials demonstrate vastly better performance when paired with metal gate electrodes rather than traditional poly-silicon gate electrodes.

Depending on the design of the transistors used in the CMOS process, the constraints placed on the metal gate material are somewhat different. For a planar, bulk or partially depleted, single-gate transistor, short-channel effects (SCE) are typically controlled through channel dopant engineering. Requirements on the transistor threshold voltages ($V_t$) then dictate the gate work-function values must be close to the conduction and valence bands of the substrate semiconductor. A "mid-gap" work function gate electrode that is located too close to the middle of the p and n channel work function range is inadequate because it typically results in a transistor having either a threshold voltage that is too large for high-performance applications or a compromised SCE when the effective channel doping is reduced to lower the threshold voltage. For non-planar or multi-gate transistor designs, the device geometry better controls SCE and the channel may then be more lightly doped and potentially fully depleted at zero gate bias. For such devices, the threshold voltage can be determined primarily by the gate metal work function. However, even with the multi-gate transistor's improved SCE, it is typically necessary to have a gate electrode work function about 250 mV above mid-gap for an nMOS transistor and about 250 mV below mid-gap for a pMOS transistor. Therefore, a single mid-gap gate material is also incapable of achieving ideal threshold voltages for both pMOS (a MOSFET with a p-channel) and nMOS (a MOSFET with an n-channel) multi-gate transistors.

For these reasons, CMOS devices generally utilize two different metal gate electrodes, an n-type electrode and a p-type electrode, having two different work function values. A gate electrode has an n-type work function if the electrode material's work function is near (e.g., within +/−0.3 eV) of the energy level of the underlying substrate material's conduction band. Conversely, a gate electrode has a p-type work function if the electrode material's work function is near the energy level of the substrate material's valence band. Silicon has a conduction band energy level of approximately 4.1 eV and a valence band energy level of approximately 5.2 eV. Thus, for a silicon substrate, the gate electrode of a negative channel MOSFET (or NMOS) device would have an n-type work function of approximately 4.1 eV (+/−0.3 eV), and the gate electrode of a positive channel MOSFET (or PMOS) device would have a p-type work function of approximately 5.2 eV (+/−0.3 eV). To change the work function of metal gate materials and achieve desired threshold voltages, two different metals are typically utilized for nMOS and pMOS devices. This method is commonly referred to a dual-metal gate CMOS process.

Figure 1:
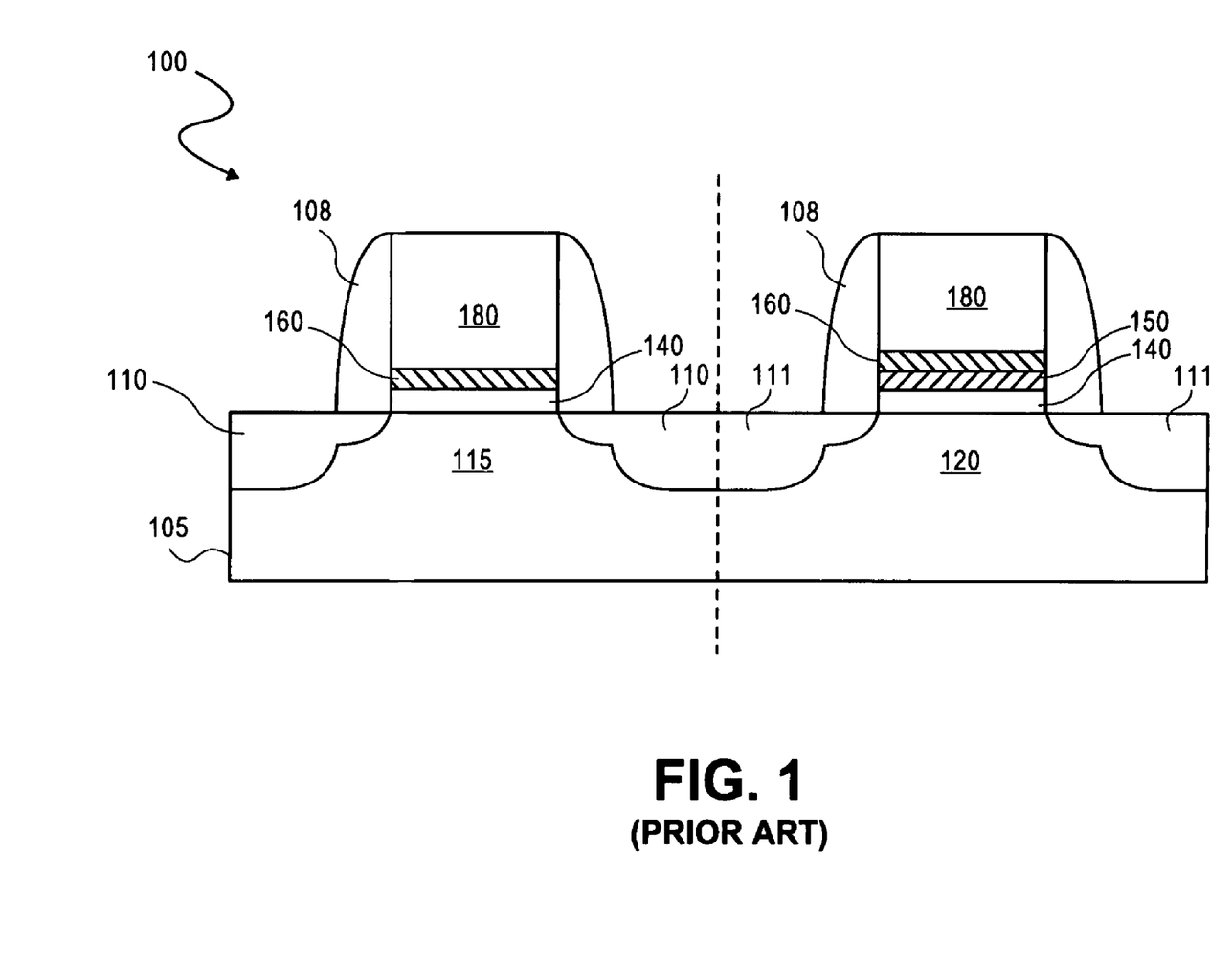
FIG. 1 depicts a cross sectional view of a CMOS device employing conventional gate metal stacks.

The n-type and p-type metal gate materials used to set work function may not be good conductors. In this case, it is desirable to use a relatively thin layer of the work function metal having optimal work function characteristics to achieve a desired threshold voltage, and then form another layer of a relatively good conductor over the work function metal to keep the gate electrode resistance low while keeping the work function metal thickness to a minimum so that manufacturing is simplified. For example, a silicided polysilicon capping layer may be formed over the work function metal to lower the bulk resistance of the gate electrode. One such conventional CMOS device 100 is shown in FIG. 1, where substrate 105, has a pMOS device with a p-channel 115 and an nMOS device with an n-channel 120. The pMOS device 115 having a source and drain 110 proximate to a gate isolation spacer 108 surrounding a gate stack. The gate stack including a gate insulator 140 and a gate electrode having a p-metal 160 (a metal having a work function appropriate for a low pMOS transistor threshold voltage) and silicided polysilicon cap 180. The nMOS device 120 having a source and drain 111 proximate to a gate isolation spacer 108 surrounding a gate stack. The gate stack including the gate insulator 140 and a gate electrode having an "n-metal" 150 (a metal having a work function appropriate for a low nMOS transistor threshold voltage), the "p-metal" 160, and silicided polysilicon cap 180. The p-metal 160 may be tolerated as an artifact in the nMOS device gate stack in favor of reducing the number of masking steps required to define the gate stacks of the CMOS device.

However, even with silicided polysilicon cap 180, the bulk resistance of the gate electrode, becomes unacceptably high as the dimension of the gate electrode is scaled. While a low resistance metal, such as aluminum, could be employed to further lower the gate electrode bulk resistance below that achievable with silicided polysilicon cap 180, the presence of a low resistance capping metal in close proximately to the MOS junction is problematic for many reasons. Most notably, diffusion of the capping metal into the MOS junction can cause deep level traps shifting threshold voltages or otherwise render a transistor inoperable.

DETAILED DESCRIPTION OF THE PRESENT INVENTION

In various embodiments, a gate metal stack for CMOS is described with reference to figures. However, certain embodiments may be practiced without one or more of these specific details, or in combination with other known methods and materials. In the following description, numerous specific details are set forth, such as specific materials, dimensions and processes, etc., in order to provide a thorough understanding of the present invention. In other instances, well-known semiconductor processes and manufacturing techniques have not been described in particular detail in order to not unnecessarily obscure the present invention. Reference throughout this specification to "an embodiment" means that a particular feature, structure, material, or characteristic described in connection with the embodiment is included in at least one embodiment of the invention. Thus, the appearances of the phrase "in an embodiment" in various places throughout this specification are not necessarily referring to the same embodiment of the invention. Furthermore, the particular features, structures, materials, or characteristics may be combined in any suitable manner in one or more embodiments.

Described herein are metal gate electrodes for CMOS devices and methods of forming a metal gate electrode stack including a diffusion barrier layer, wherein the diffusion barrier layer is tuned to a particular work function so that it also serves as a work function metal for a pMOS transistor. In an embodiment, the gate electrode stack further comprises a low resistance metal of superior conductivity, such as, but not limited to, silver, copper, aluminum, tungsten and alloys thereof. Diffusion of the low resistance capping metal into the MOS junction is prevented by the diffusion barrier layer. In a further embodiment of the present invention, the work function of the barrier layer is modulated to be p-type by altering a nitrogen concentration in the film. Thus, in one implementation, a layer containing metal, carbon and nitride, referred hereinafter as a metal carbonitride, serves as the p-metal setting the threshold voltage of a pMOS transistor while also serving as a diffusion barrier for either or both pMOS and nMOS transistors of a CMOS device.

In embodiments of the present invention, metal carbonitride films are tuned to have a p-type work function by incorporating an appropriate atomic percent of nitrogen in a metal carbide film for the desired work function. The work function of the metal carbonitride is dependant on the metal selected as well as the atomic percentages of carbon in nitrogen. In various embodiments, the metal carbide comprises approximately 30 atomic percent to 50 atomic percent of a metal selected from group consisting of tantalum, titanium, tungsten, nickel and cobalt. For a given atomic percentage of metal, the atomic percentage of nitrogen relative to the atomic percentage of carbon in the metal carbonitride may be adjusted to achieve the desired work function. For example, a metal carbide having an n-type work function becomes increasingly p-type as nitrogen is added in place of carbon to form a metal carbonitride. In one embodiment, a tantalum carbonitride film with approximately 30 atomic percent tantalum is tuned to have a work function between approximately 4.3 eV to approximately 5.2 eV by incorporating an amount of nitrogen into the film ranging from fractional atomic percent nitrogen up to approximately 50 atomic percent, respectively. A tantalum carbonitride film with approximately 30 atomic percent tantalum will become p-type with between approximately 30 atomic percent and approximately 50 atomic percent nitrogen. In a particular embodiment, a p-metal film is formed from 30 atomic percent tantalum, 30 atomic percent carbon and 30 atomic percent nitrogen with other constituents making up the balance. In another embodiment, a p-metal film is formed from 30 atomic percent tantalum, 10 atomic percent carbon and 50 atomic percent nitrogen with other constituents making up the balance.

In an embodiment of the present invention, because the diffusion barrier is capable of providing a p-type work function, an n-metal first, p-metal last dual metal process scheme is utilized. This embodiment alleviates integration difficulties that can result when only the n-metal (or neither the n-metal or p-metal) is capable of serving as a diffusion barrier. If neither n-metal nor p-metal is capable of serving as a diffusion barrier, then a distinct diffusion barrier layer is required over both the n-metal and p-metal. Similarly, if only the n-metal can serve as a diffusion barrier, the n-metal must be applied after a selective patterning of p-metal so that the n-metal may then provide a diffusion barrier for both the p-type device and the n-type device. However, the characteristics of the p-metal may make it difficult to pattern the p-metal prior depositing an n-metal. For example, if the p-metal is formed over high aspect ratio topography using a physical deposition process, the p-metal film may pinch-off or keyhole making subsequent patterning of the p-metal in the topography extremely difficult. Thus, if the p-metal is deposited over the n-metal (which may not have the same pinch-off problems of the p-metal), a CMOS device may be formed within the high aspect ratio topography. Thus, in a specific embodiment, a n-metal first, p-metal last dual metal process scheme enabled by the barrier qualities of the p-metal is employed to avoid integration issues that may otherwise exist with a p-metal first, n-metal last dual metal process scheme.

In another embodiment, a single metal carbonitride film is employed as both a diffusion barrier and a p-metal to increase the physical dimension of the low resistance cap layer for a given gate electrode dimension by eliminating the need for a barrier layer distinct from the p-metal and/or n-metal. In one implementation of the present invention, a barrier layer is formed to encapsulate at least three sides of a three dimensional gate metal cap layer to prohibit outdiffusion. In one such implementation, discussed in more detail below, a gate replacement method is applied wherein the barrier layer is deposited in a trench in a masking layer, covering the masking layer sidewalls, prior to filling the remainder of the trench with a low resistance cap metal. Because the cross sectional area of the gate electrode is typically less than 1000 nm$^2$ while the width of the gate electrode may be on the order of micrometers, embodiments wherein the cross-section of the low resistance capping is increased by combining the roles of diffusion barrier and p-metal are particularly advantageous for reducing gate resistance of a CMOS device relative to conventional devices.

In yet another alternate embodiment, a metal carbonitride p-metal is combined with an n-metal that is also capable of serving as a diffusion barrier so that both the p-metal and n-metal may be sequentially deposited and patterned with either the p-metal or n-metal being deposited and patterned first. In such an embodiment, neither the n-type or p-type transistor need include more than a single work function metal film in contact with a low resistance gate metal cap (in contrast to the two work function metal layers 140 and 150 in the nMOS device 120 of FIG. 1).

While an n-metal first, p-metal last, dual metal gate replacement scheme for a planar transistor device is described below in great detail, one of ordinary skill in the art would appreciate that the benefits of the present invention may be applied to other integration schemes. Either planar or non-planar transistor designs (such as tri-gate, dual-gate, omega-gate, etc.) employing either subtractive gate patterning schemes or gate replacement schemes are adaptable to the present invention.

A typical replacement gate method utilizes a gate electrode placeholder, or mandrel, around which the components of a semiconductor device are formed. The gate electrode placeholder is then removed and a final gate electrode formed.

Figure 2A:
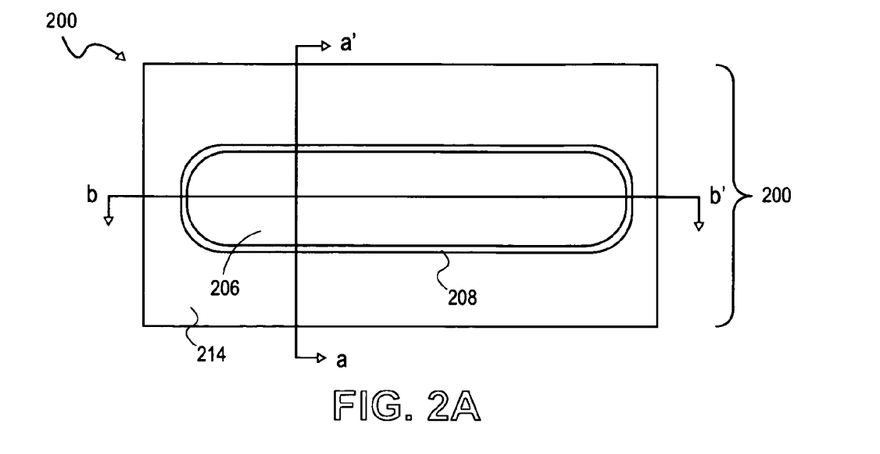
FIGS. 2A-C illustrate top-down and cross-sectional views representing a planar CMOS device prior to performing a replacement gate process in accordance with an embodiment of the present invention.
Figure 2B:
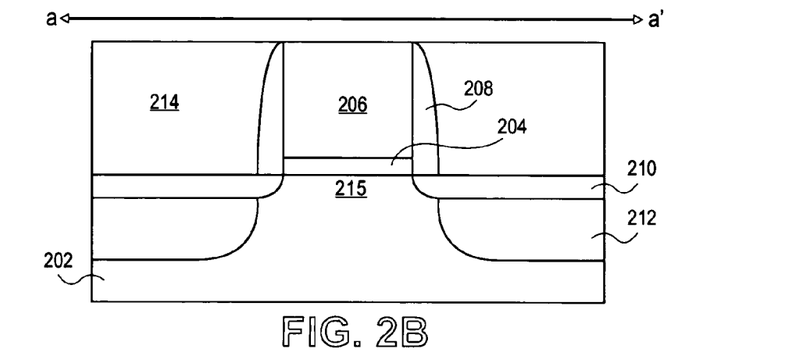
Figure 2C:
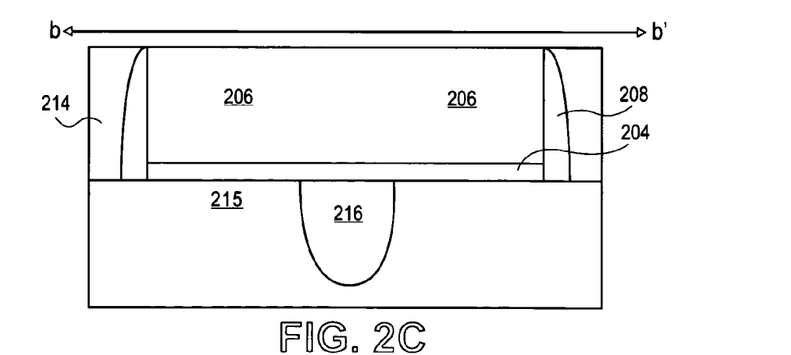

FIGS. 2A-C illustrate top-down and cross-sectional views representing a planar CMOS device prior to performing a replacement gate process. A top-down view of an exposed CMOS 200 is provided in FIG. 2A.

As shown in FIG. 2A, a gate electrode placeholder 206 may be formed with a material suitable for removal at the replacement gate step, as discussed below. In one embodiment, gate electrode placeholder 206 is comprised of polycrystalline silicon, amorphous silicon, silicon dioxide, silicon nitride, a metal layer or a combination thereof.

A gate isolation 208 spacer may be formed between inter-layer dielectric layer 214 and gate electrode placeholder 206, as depicted in FIG. 2A. Gate isolation spacer 208 may be formed from any material and by any technique suitable to provide a conformal dielectric layer adjacent the sidewalls of gate electrode placeholder 206. In one embodiment, gate isolation spacer 208 is comprised of an insulating layer. In a particular embodiment, gate isolation spacer 208 is comprised of silicon dioxide, silicon oxy-nitride, carbon-doped silicon oxide, silicon nitride, carbon-doped silicon nitride or a combination thereof. In accordance with an embodiment of the present invention, gate isolation spacer 208 is formed by depositing a blanket material layer by a chemical vapor deposition process. The material layer used to form gate isolation spacer 208 may be deposited to a thickness selected to determine the final width of gate isolation spacer 208. In one embodiment, gate isolation spacer 208 has a final thickness in the range of 50-350 Å. The material layer used to form gate isolation spacer 208 may be shaped by an anisotropic etch process. In one embodiment, the final form of gate isolation spacer 208 is determined by using a vertical dry or plasma etch process comprising fluorine. Gate electrode placeholder 206 and gate isolation spacer 208 may be incased in an inter-layer dielectric 214. Inter-layer dielectric 214 may be comprised of any material suitable to provide physical support and electrical isolation for gate electrode placeholder 206 and the eventual replacement gate electrode discussed below. In one embodiment, inter-layer dielectric 214 is comprised of silicon dioxide, a silicate or a carbon-doped oxide with 0-10% porosity.

FIG. 2B represents a cross-sectional view down the a-a' projection of the structure illustrated in FIG. 2A. Gate electrode placeholder 206, gate isolation spacer 208 and inter-layer dielectric 214 from FIG. 2A are all depicted in FIG. 2B in their cross-sectional form. In accordance with an embodiment of the present invention, the top surfaces of gate electrode placeholder 206, gate isolation spacer 208 and inter-layer dielectric 214 are all substantially flush with one another, as depicted in FIG. 2B.

Referring further to FIG. 2B, gate electrode placeholder 206 sits above a substrate 202. Substrate 202 may be formed from any semi-conducting material that can provide a conductive channel when CMOS 200 is in an ON state. In one embodiment, substrate 202 is comprised of a single crystalline silicon, germanium or silicon/germanium layer doped with an appropriate charge carrier, such as but not limited to phosphorus, arsenic, boron, indium or a combination thereof. In another embodiment, substrate 202 is comprised of a III-V material such as but not limited to gallium nitride, gallium phosphide, gallium arsenide, indium phosphide or indium antimonide. In one embodiment, substrate 202 is comprised of an epitaxial layer grown atop a distinct crystalline substrate, e.g. a silicon epitaxial layer grown atop a boron-doped bulk silicon crystalline substrate. In accordance with another embodiment of the present invention, substrate 202 comprises an insulating layer. In one embodiment, the insulating layer is comprised of silicon dioxide, silicon nitride, silicon oxy-nitride or a high-k dielectric layer. In an embodiment, substrate 202 is comprised of an epitaxial layer and a bulk crystal substrate with an insulating layer between the bulk crystal substrate and the epitaxial layer forming, for example, a silicon-on-insulator substrate.

A gate dielectric 204 is formed in between gate electrode placeholder 206 and substrate 202, as depicted in FIG. 2B. Gate dielectric 204 may be formed with any material suitable to insulate a gate electrode from substrate 202. In one embodiment, gate dielectric 204 is formed by a thermal oxidation process or a PE-CVD process and is comprised of silicon dioxide or silicon oxy-nitride. In another embodiment, gate dielectric 204 is formed by chemical vapor deposition or atomic layer deposition and is comprised of a high-k dielectric layer such as, but not limited to, hafnium oxide, zirconium oxide, hafnium silicate, hafnium oxy-nitride or lanthanum oxide. In one embodiment, gate dielectric 204 is the final gate dielectric layer, i.e. it is not subsequently replaced.

Referring again to FIG. 2B, tip extensions 210 may be formed by implanting charge carrier dopant impurity atoms into substrate 202. In accordance with an embodiment of the present invention, gate electrode placeholder 206 acts to mask a portion of substrate 202, forming self-aligned tip extensions 210. By self-aligning tip extensions 210 with gate electrode placeholder 206, channel 215 may be formed in the portion of substrate 202 that is underneath gate electrode placeholder 206 and gate dielectric 204, as depicted in FIG. 2B. Channel 215 may further be formed in a well region (not shown) within substrate 202 to allow for complementary channel types (i.e. n-type and p-type), as is commonly employed in CMOS configurations. In one embodiment, boron, arsenic, phosphorus, indium or a combination thereof is implanted into substrate 202 to form tip extensions 210. In another embodiment, the charge carrier dopant impurity atoms implanted to form tip extensions 210 of opposite conductivity to channel region 215. In accordance with one embodiment of the present invention, substrate 202 is comprised of a III-V material and the charge carrier dopant impurity atoms implanted to form tip extensions 210 are selected from the group consisting of carbon, silicon, germanium, oxygen, sulfur, selenium or tellurium.

Source/drain regions 212 may be formed by self-alignedly implanting charge carrier dopant impurity atoms into substrate 202. The width of gate isolation spacers 208 may play a role in determining the dimensions and location of source/drain regions 212. As will be apparent to one skilled in the art, both N-type and P-type source/drain regions may be formed. In accordance with an embodiment of the present invention, N-type and P-type source/drain regions are formed in a device with a gate electrode (e.g. an SRAM device) spanning an isolation region 216, as depicted in FIG. 2c. In one embodiment, boron, arsenic, phosphorus, indium or a combination thereof is implanted into a group IV substrate 202 to form source/drain regions 212. In accordance with one embodiment of the present invention, substrate 202 is comprised of a III-V material and the charge carrier dopant impurity atoms implanted to form source/drain regions 212 are selected from the group consisting of carbon, silicon, germanium, oxygen, sulfur, selenium or tellurium.

FIG. 2C represents a cross-sectional view down the b-b' projection of the structure illustrated in FIG. 2A. Gate electrode placeholder 206, gate isolation spacer 208, inter-layer dielectric 214 from FIG. 2A and gate dielectric 204 and channel region 212 from FIG. 2B are all depicted in FIG. 2C in cross-section. Isolation region 216 may be formed in substrate 202, as depicted in FIG. 2C. Well isolation region 216 may be formed from any material suitable to electrically isolate two semi-conducting regions of opposite conductivity type. In accordance with an embodiment of the present invention, well isolation region 216 is comprised of silicon dioxide, silicon oxy-nitride, carbon-doped silicon oxide, silicon nitride, carbon-doped silicon nitride or a combination thereof. In one embodiment, well isolation region 216 is formed by a shallow-trench isolation process.

The structure depicted in FIG. 2A-2C may be further processed with a replacement gate method. FIGS. 3A-3G illustrate cross-sectional views, down the b-b' projection from FIG. 2C, representing a planar CMOS device at various stages of a replacement gate process, in accordance with an embodiment of the present invention.

Figure 3A:
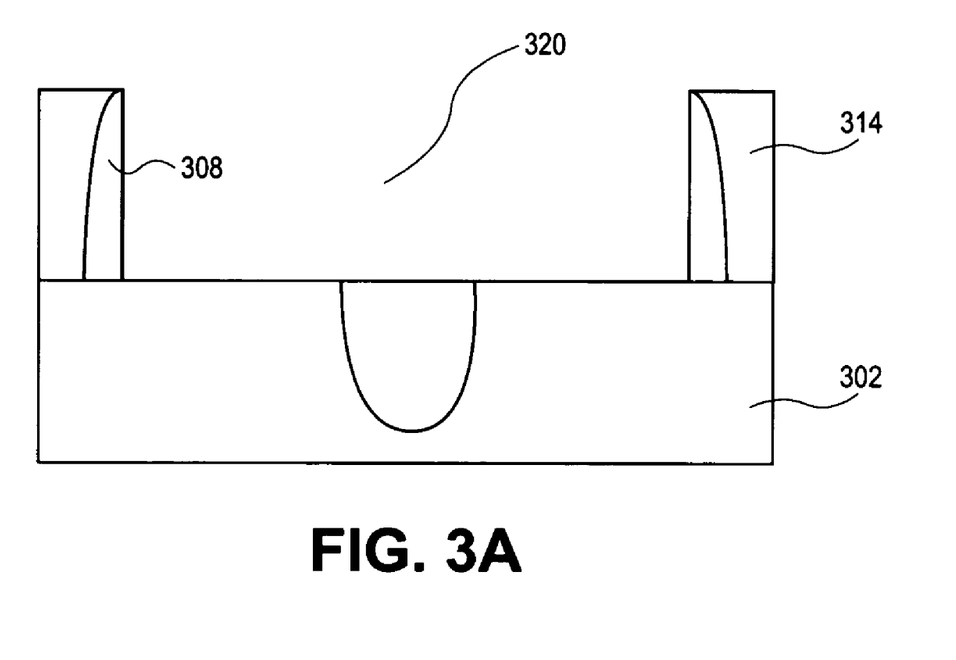
FIGS. 3A-3G depict cross-sectional views representing a planar CMOS device at various stages of a replacement gate process in accordance with an embodiment of the present invention.

Referring to FIG. 3A, a gate electrode placeholder (206 from FIGS. 2A-C) may be removed by any suitable technique that does not significantly impact inter-layer dielectric 314 or gate isolation spacers 308. In accordance with an embodiment of the present invention, a gate electrode placeholder is removed by a dry etch or wet etch process. In one embodiment, a gate electrode placeholder is comprised of polycrystalline silicon or amorphous silicon and is removed with a dry etch process comprising $SF_6$. In another embodiment, a gate electrode placeholder is comprised of polycrystalline or amorphous silicon and is removed with a commonly known wet etch process. In one embodiment, a gate electrode placeholder is comprised of silicon nitride and is removed with a wet etch process comprising aqueous phosphoric acid. In another embodiment, a gate electrode placeholder comprises a metal layer that is removed with a Piranha ($H_2SO_4/H_2O_2/H_2O$) wet etch process.

A gate dielectric layer placeholder (204 from FIGS. 2B-C) may also be removed by any suitable technique that does not significantly impact inter-layer dielectric layer 314, gate isolation spacers 308 or substrate 302. In accordance with an embodiment of the present invention, a gate dielectric layer placeholder is removed by a dry etch or wet etch process. In one embodiment, a gate dielectric layer placeholder is comprised of silicon dioxide or silicon oxy-nitride and is removed with a wet etch comprising aqueous hydrofluoric acid, ammonium fluoride or both. In one embodiment, a gate electrode placeholder is removed in the same step as the removal of a gate dielectric layer placeholder. The removal of the gate electrode and dielectric placeholders forms trench 320, as depicted in FIG. 3A. In accordance with an embodiment of the present invention, the narrowest length and/or width of trench 320 is less than 32 nanometers. In another embodiment (not shown), gate dielectric layer 204 from FIGS. 2B-C is not sacrificial and remains as the device gate dielectric.

Figure 3B:
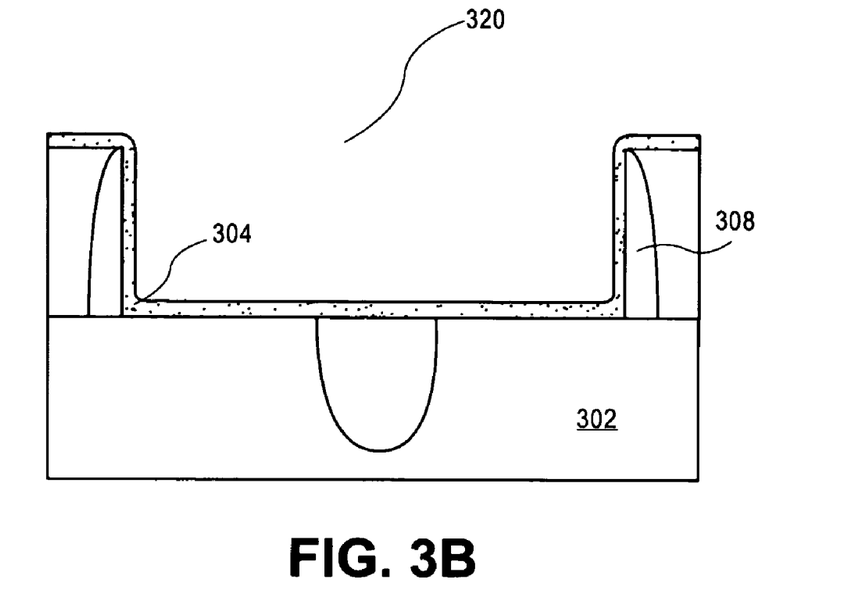

Referring to FIG. 3B, a gate dielectric layer 304 may be formed upon substrate 302. In accordance with an embodiment of the present invention, gate dielectric 304 is formed with any material suitable to insulate a gate electrode from substrate 302. In one embodiment, gate dielectric 304 is formed by a thermal oxidation process and is comprised of silicon dioxide or silicon oxy-nitride. In another embodiment, gate dielectric 304 is formed by chemical vapor deposition or atomic layer deposition and is comprised of a high-k dielectric layer selected from the group consisting of hafnium oxide, hafnium silicate, lanthanum oxide, zirconium oxide, zirconium silicate, tantalum oxide, barium strontium titanate, barium titanate, strontium titanate, yttrium oxide, aluminum oxide, lead scandium tantalum oxide, lead zinc niobate or a combination thereof. In one embodiment, gate dielectric 304 is deposited conformal with the top surface of substrate 302, with the sidewalls of gate isolation spacers 308 and within trench 320, as depicted in FIG. 3B.

Figure 3C:
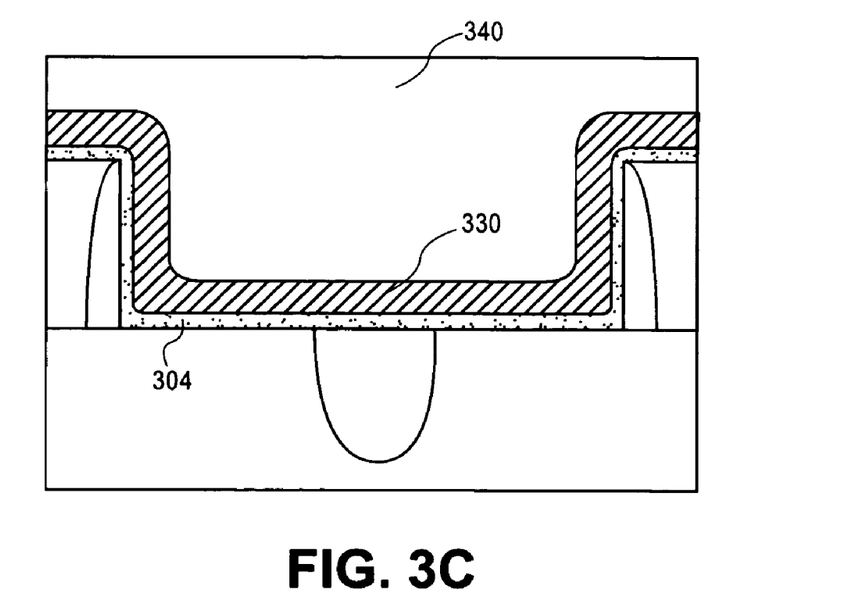

Referring to FIG. 3C, an n-metal 330 is formed above gate dielectric 304. N-metal 330 is formed from any material with a proper work function for an N-type transistor that is also suitable for filling a region between gate isolation spacers 308. In one embodiment, the work function of n-metal 330 is in the range of 3.9 eV-4.2 eV. In one embodiment, n-metal 330 is comprised of a silicide of doped polycrystalline silicon. In another embodiment, n-metal 330 is comprised of a metal selected from the group consisting of a metal nitride, a metal carbide, hafnium, zirconium, titanium, tantalum, aluminum, ruthenium, palladium, platinum, cobalt, nickel, a conductive metal oxide or a combination thereof. In one embodiment, n-metal 330 has a thickness in the range of 15-200 Å. In an embodiment of the present invention, n-metal 330 is deposited by a physical vapor deposition, chemical vapor deposition, atomic layer deposition, electroplating or an electroless-deposition process.

Referring again to FIG. 3C, masking layer 340 may be formed on n-metal 330. Masking layer 340 may be formed from any material suitable for undergoing a lithographic patterning process, e.g. a photo-resist. In another embodiment, masking layer 340 is also comprised of a sacrificial light-absorbing material (SLAM), such as, but not limited to, a spin-on glass material.

Figure 3D:
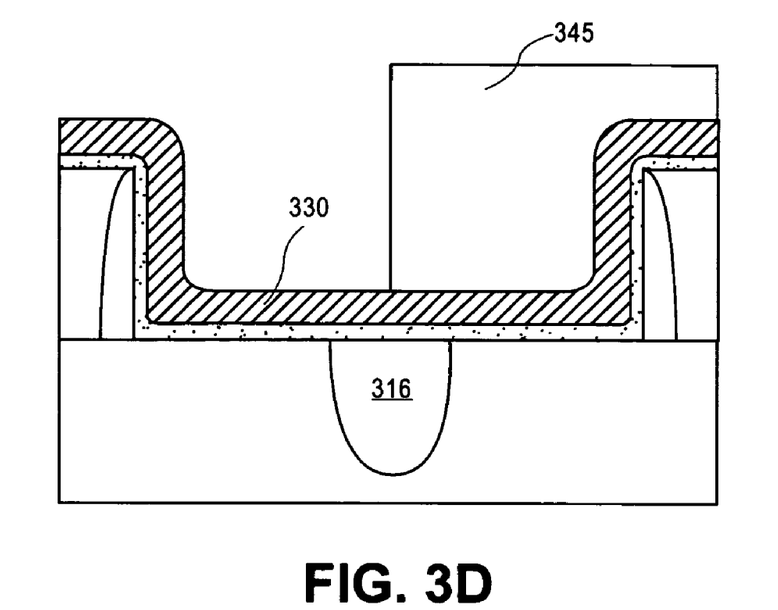
Figure 3E:
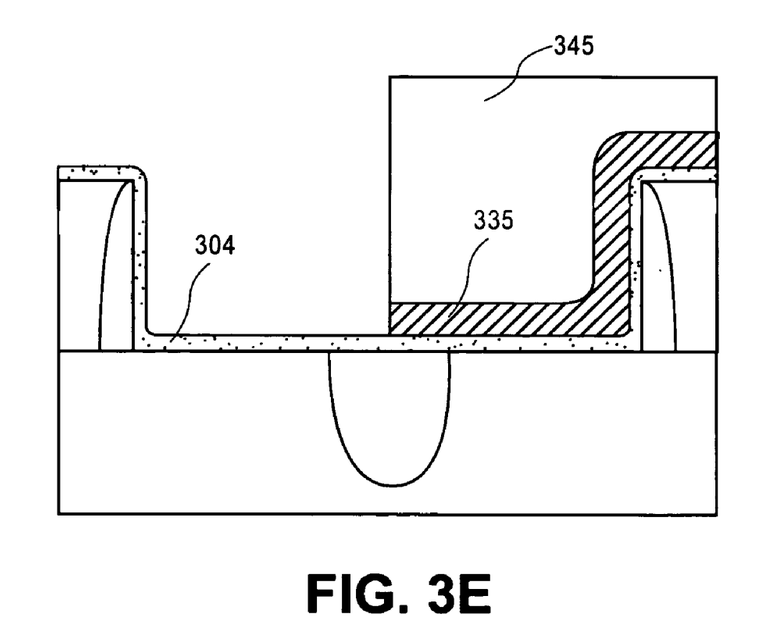

Referring to FIG. 3D, masking layer 340 is patterned to form patterned masking layer 345 and to expose a portion of n-metal 330. Masking layer 340 may be patterned by any suitable method that provides the desired dimensions of the resulting CMOS device 400 from below. In one embodiment, masking layer 340 is patterned with a conventional lithography process using 248 nm or 193 nm wavelengths, to expose a portion of n-metal 330 on only one side of isolation region 316, as depicted in FIG. 3D. The exposed portion of n-metal 330 may then be removed to form an n-metal gate electrode 335, as depicted in FIG. 3E. In one embodiment, the exposed portion of n-metal 330 is removed with an oxidizing chemistry.

Patterned masking layer 345 is then removed with any technique leaving a negligible amount of residue that does not significantly impact first metal gate electrode 335 or dielectric layer 304. In one embodiment, patterned masking layer 345 is comprised of a photo-resist and is removed with an etchant, such as, but not limited to, $NH_4OH$ and TMAH.

Figure 3F:
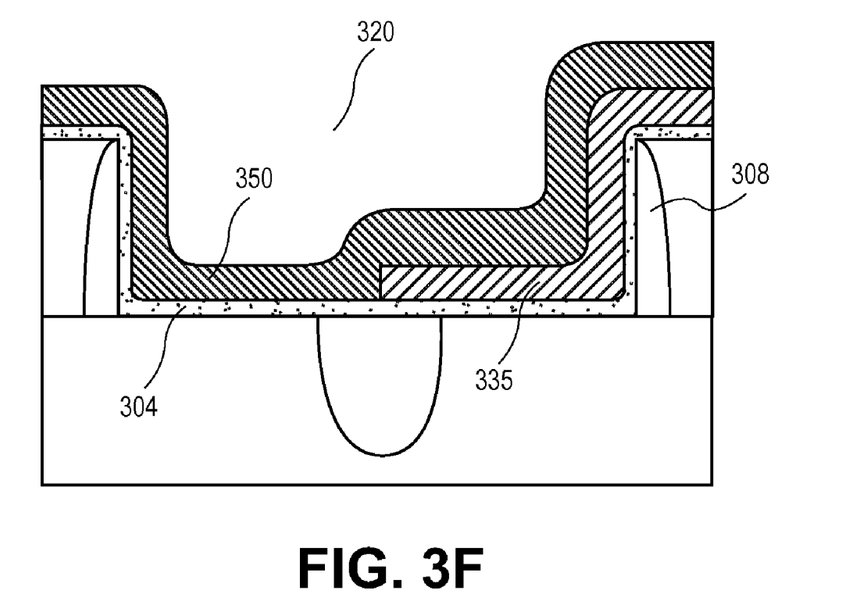

As shown in FIG. 3F, p-metal 350 is then deposited. In accordance with an embodiment of the present invention, p-metal 350 is deposited conformal with the exposed portion of gate dielectric 304 at the bottom of trench 320 and with n-metal gate electrode 335, as depicted in FIG. 3E to serve as a diffusion barrier over the n-metal gate electrode 335 of the n-type transistor and the gate dielectric layer 304 of the p-type transistor. In one embodiment, p-metal 350 has a thickness in the range of 25-500 Å. In one implementation of the present invention, p-metal 350 is amorphous to provide a superior diffusion barrier relative to a polycrystalline film.

In an embodiment of the present invention, p-metal 350 is a metal carbonitride, wherein the work function of a metal carbonitride film is modulated by altering the nitrogen concentration in the film. In one particular embodiment the metal carbonitride is tantalum carbonitride ($Ta_xC_yN_z$ or TaCN). In other embodiments, p-metal 350 comprises carbon, nitrogen and a metal selected from the group consisting of titanium, tungsten, nickel and cobalt. The concentration of carbon and nitrogen may be varied depending on the work function requirements for the P-type transistor. Thus, in one embodiment, the metal carbonitride contains sufficient atomic percent nitrogen to have a work function of at least 4.8 eV. As nitrogen concentration is increased, the work function of metal carbide will increase from an n-type work function, below the midgap of silicon, toward valence band energies for a p-type work function. In a particular embodiment, between 30 atomic percent and 50 atomic percent nitrogen is incorporated into a TaC film, initially having a work function of between 4.3 eV and 4.4 eV, to form a TaCN film having a final p-type work function between 4.8 eV and 5.2 eV. Thus, a film suitable as a diffusion barrier having a tunable work function is provided.

A p-metal 350 may generally be deposited by any commonly known method, such as, but not limited to, physical vapor deposition, chemical vapor deposition, atomic layer deposition, electroplating or an electro-less deposition process. In a particular embodiment, a metal carbonitride layer, such as TaCN, may be generated by a deposition process that does not utilize amine or imine containing materials. The exclusion of amine and/or imine compounds eliminates the conventional problem of out-gassing of the amines or imines that often poisons photoresist layers in subsequent processing steps. Exclusion of amine and/or imine compounds also enables the amount of nitrogen incorporation for tuning the work function to be independently controlled via a separate source. In one implementation, the precursor material may be an organometallic precursor material that includes tantalum (Ta), hydrogen (H), and cyclopentadienyl (Cp). For example, in an implementation, the precursor material may be $Cp_2TaH_3$, also known as tantalocene trihydride.

In other implementations, organometallic precursors other than $Cp_2TaH_3$ may be used to form TaCN layers or alternate metal carbonitride layers. Examples of other specific organometallic precursor materials that may be used in implementations of the invention include, but are not limited to: $CpTa(CO)_4$; $(MeCp)Ta(CO)_4$; $CpTa(CO)_3(R)$, where R is $PPh_3$, $AsPh_3$, or any other neutral 2 electron donor; $CpTa(CO)_3(R)$, where R is THF, $PPh_3$, $PCy_3$, or any other neutral 2 electron donor; $CpTa(CO)_2(C_5H_5)$; $Cp_2TaH(CO)$; $Cp_2TaR(CO)$, where R is Me, $CH_2Ph$, Ph, or any other negatively charged 2 electron donor; $CP_2TaH(CH_2=CHR')$, where R' is H, Me, Et, Pr, or Ph; $Cp_2Ta(CH_2CH_2R')(CNR)$, where R and R' are each independently chosen from H, Me, Et, Pr, Ph, or any other negatively charged 2 electron donor; $CpTaXMe(CHCMe_3)$, where X is Cl, Me, or any other negatively charged 2 electron donor; $Cp'TaX(CH_2Ph)(CHPh)$, where $Cp'$ is $C_5H_4Me$, $C_5Me_5$, or any other functionalized cyclopentadienyl ligand, and where X is Cl, $CH_2Ph$, or any other negatively charged 2 electron donor; $Cp^*Ta(PMe_3)(C_2H_4)(CHCMe_3)$; $Cp_2TaMe(CH_2)$; $Cp(MeCp)TaMe(CH_2)$; $Cp_2TaMe(CHR)$, where R is H, Me, Ph, $SiMe_3$, or any other negatively charged 2 electron donor; $Cp_2Ta(CHPh_2)(CHCMe_3)$; $Cp_2Ta(CH_2Ph)(CHPh)$; $Cp^*TaMe_3Ph$; $Cp^*TaMe_2(Me_2CO)$; $Cp^*TaMe_2(C_2H_4)$; $Cp_2TaMe_3$; $Cp_2TaPh_2$; $Cp^*TaMe_4$; $Cp_2Ta(Cp)_2$; $Cp'Me_2Ta$ (indenyl); $Cp_2TaH(CH_2=CHR)$, where R is Me, Et, nPr, or any other negatively charged 2 electron donor; $Cp_2Ta$(cyclopentene); $Cp_2Ta$(benzyl)(CHPh); $Cp_2ClTaCH(tBu)$; $CpTa(CH(tBu)X(PMe_3)_2$, where X is H, Me, Et, Pr, halide, or Ph; $Cp_2TaMe(C_2H')$; $CH_2=Ta(Cp)_2CH_3$; $Cp_2Ta(nPr)(C_8H_8)$; $CpTa(CO)_x(PhCCPh)$, where x equals 1 or 2; $Cp_2Ta$(allyl); $Cp_2Ta$(methallyl); $Cp'TaH_3$; $Cp_2TaH(CO)$; $Cp_2TaH$(propene); $Cp_2TaMe_3$; $Cp^*TaCO_4$; $Cp^*TaMe_4$; $Cp_2Ta(nPr)(CNMe)$; $Cp^*TaMe_2$(benzene); $Cp^*Ta(CHCMe_3)$(ethene)$PMe_3$; $Ta(CO)_3(C_7H_7)$; $Ta_2(CO)_{12}$; $TaH(CO)_2(Dmpe)_2$; $TaX(CO)_2[Me_2P(CH_2)_2PR_2]_2$, where X is Cl, I, or any other negatively charged 2 electron donor and R is Et, iPr, or any other negatively charged 2 electron donor; $(RHg)Ta(CO)_4$, where R is Et, Ph, or any other negatively charged 2 electron donor; $Ph_3SnTa(CO)_4$; $[(C_5H_4nBu)Ta(CO)_3\{Si(Cl_8H_{37})_2\}]_2$; $((CH_3)_3CCH_2)_3Ta=CHC(CH_3)_3$; $((R_{1a}CR_{2a}R_{3a})((R_{1b}CR_{2b}R_{3b})((R_{1c}CR_{2c}R_{3c})Ta=CR_4R_5$ where $R_n$ is H, Me, Et, iPr, nPr, tBu, sBu, iBu, nBu, amyl, F, Cl, Br, I, or any other negatively charged 2-electron donor; $Ta$(allyl)$_4$; $Ta$(1-methyallyl)$(C_4H_6)_2$; and $TaMe_5$. As previously mentioned, organometallic precursor materials similar to the ones mentioned above, but using metals other than tantalum, may be used as well.

In one embodiment, in addition to the precursor material, co-reactants consisting of a doping agent and a plasma are also provided. The co-reactants may include nitrogen gas ($N_2$) or another non-amine reactive gas as the doping agent and a plasma containing hydrogen, argon, helium, or combinations of the above. The precursor material and the co-reactants are applied to the surface of the substrate to react and form a TaCN film that forms at least a portion of p-metal 350. The precursor material, such as $Cp_2TaH_3$, may be introduced to the reaction chamber through a vapor deposition process. The vaporizer temperature may be around 90° C. and argon may be used as a carrier gas. In various implementations of the invention, the vapor deposition process may be an atomic layer deposition (ALD) process or a chemical vapor deposition (CVD) process that will yield a conformal p-metal 350. The process cycle may introduce the precursor material and the co-reactants into the reaction chamber in discrete pulses or in a continuous manner, depending on the desired properties of the final TaCN layer. If pulses are used, the precursor material pulse and the co-reactant pulse may be alternated. The pressure within the reaction chamber during the process cycle may range from 1 mTorr to 1000 Torr.

In one embodiment, a plasma discharge may be developed using a 13.56 MHz RF generator. Other RF frequencies and/or modes of plasma generation may also be effective. For instance, a radio frequency source, a direct current source, a pulsed direct current source, a capacitively coupled source, or a microwave source may be used. The plasma discharge may be operated either remotely or directly. In an embodiment using a direct capacitively coupled plasma, the reactor uses a parallel plate configuration. In this configuration, the plasma may be operated with a power density from 0.01 $W/cm^2$ to 10 $W/cm^2$. The optimum power density may be selected based on the process performance and film properties.

In further embodiments of the invention, the process cycle may introduce the co-reactants in separate pulses or in simultaneous pulses. In other implementations, some co-reactant pulses may separate the co-reactants while other co-reactant pulses may combine the co-reactants. For instance, the $N_2$ gas may be introduced both with and without the hydrogen plasma to instill certain physical properties in the final TaCN layer. Accordingly, some pulses may contain $N_2$ gas alone while other pulses may contain both $N_2$ gas and plasma. Some pulses may contain only plasma as well. Where $N_2$ gas alone is provided while the substrate is at elevated temperature (between 400° C. and 800° C.), a TaC film will getter nitrogen to form TaCN. Plasmas composed of other species may be used as well. It should be noted that any process steps in which a plasma is pulsed into the reaction chamber may alternately consist of pulsing the plasma after the plasma has already been introduced inside the chamber.

In one specific embodiment of the present invention, the $Cp_2TaH_3$ precursor material and the $N_2$ gas and hydrogen plasma may be applied in an alternating manner. The process cycle begins with a 10 second pulse of the process gas mixture containing the $Cp_2TaH_3$ precursor. The precursor may be vaporized using 100 sccm of argon at 50 Torr and 90° C. At these conditions, the estimated flow of the precursor is between 0.01 sccm and 0.1 sccm. Next, the reaction chamber may be purged for 20 seconds. The reaction chamber may be purged using a non-reactive gas such as argon. The purge is followed by a 10 second pulse of the $N_2$ gas and hydrogen plasma. Finally, the reaction chamber is purged again for 20 seconds. This process cycle yields a TaCN layer growth rate of approximately 0.5 Å per minute and may be repeated until the resulting TaCN layer is sufficiently thick. In some implementations, the process cycle is repeated 40 to 60 times to generate TaCN layers of sufficient thickness. It should be noted that the process of is only one implementation of the invention and it will be readily apparent to those of skill in the art that the process steps may be varied, for instance, the pulse time durations are subject to increase or decrease, depending on the deposition equipment and precursors used.

Under the conditions described, the precursor material and the co-reactants tend to react and form a TaCN film atop the substrate surface. Although the deposited TaCN film will be relatively thin, the film will have highly conformal coverage given that the precursor deposition occurs through a CVD or ALD process. Multiple process cycles are carried out to deposit several films and build up a TaCN layer of a desired thickness.

Figure 3G:
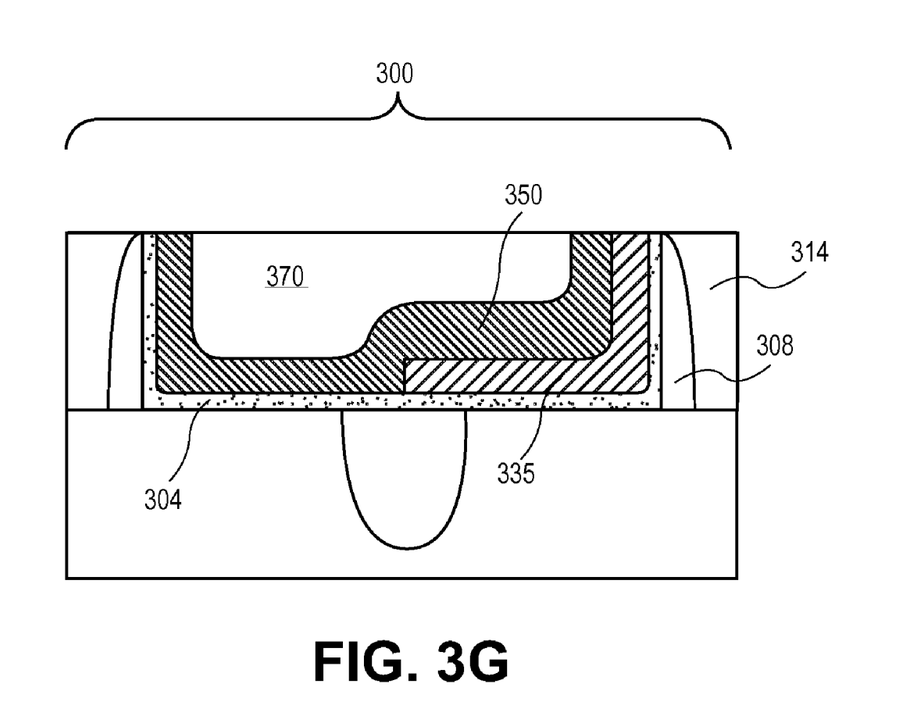

Referring to FIG. 3G, a metal cap 370 may be deposited to fill any remaining open regions of trench above p-metal 350 to form CMOS device 300. Metal cap 370 may be comprised of any material suitable for providing a low resistance interface with a contact structure used to incorporate CMOS device 300 into an integrated circuit. In one embodiment, metal cap 370 is comprised of copper, silver, aluminum, tungsten or a combination thereof. Metal cap 370 may be deposited by any commonly known means, such as physical vapor deposition, chemical vapor deposition, atomic layer deposition, electroplating or an electro-less plating process. In accordance with an embodiment of the present invention, a chemical-mechanical process step follows the deposition of metal cap 370. In one embodiment, the chemical-mechanical process step removes any material, e.g. from gate dielectric 304, from n-metal 335, from p-metal 350 or from fill metal 370, that remains above inter-layer dielectric 314 or above gate isolation spacers 308. In an embodiment a planar surface is provided, as depicted in FIG. 3G. Thus, referring to FIG. 3G, CMOS device 300 comprising a metal carbonitride as a p-metal and diffusion barrier may be formed. CMOS device 300 may subsequently be incorporated into an integrated circuit by conventional process steps, as known in the art.

Figure 4A:
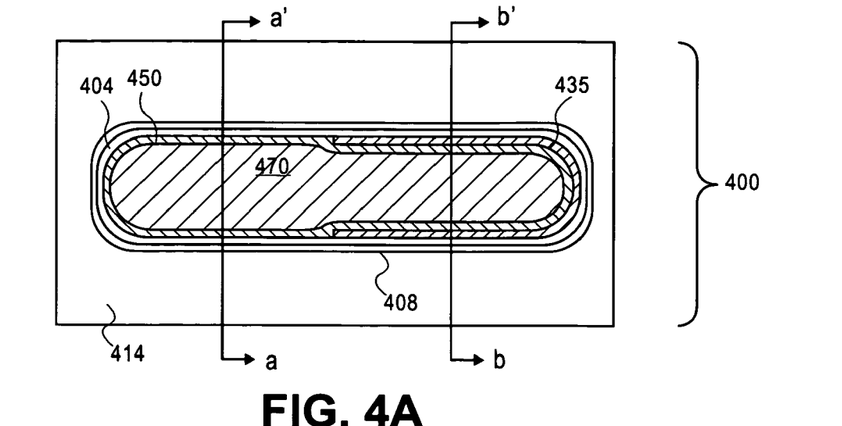
FIGS. 4A-4C depict cross-sectional views of a CMOS device employing a gate metal stack in accordance with an embodiment of the present invention.
Figure 4B:
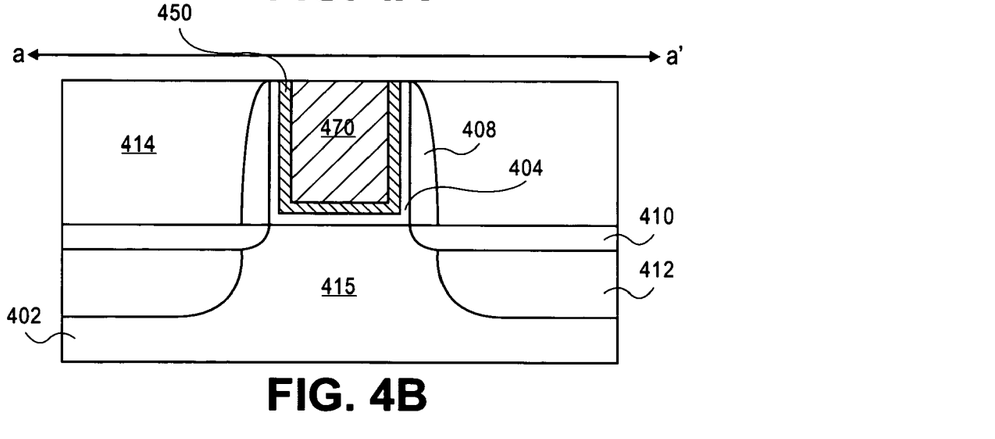
Figure 4C:
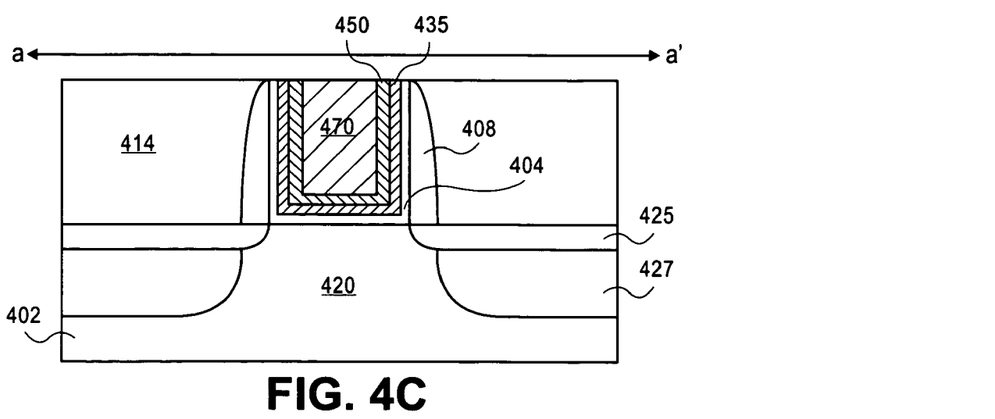

Finally, a plan view of CMOS device 400 after completion of a gate replacement process as has been described in reference to FIGS. 3A-3G is depicted in FIG. 4A. This particular CMOS device has one continuous gate electrode spanning both a pMOS and an nMOS device, such as might be fabricated for two complementary pull down transistors in a six transistor (6T) SRAM cell. As shown in FIGS. 4A-4C, the CMOS device is surrounded by inter-layer dielectric 414 and gate isolation spacer 408. CMOS device of FIG. 4A has a pMOS device in the region bisected by projection line a-a' and an nMOS device in the region bisected by projection line b-b'. In the region there between, the gate electrode extends over an isolation region (not shown) formed in the substrate 402. Thus, in FIG. 4B, a cross-sectional view taken along the a-a' line of FIG. 4A displays the pMOS device. Similarly, in FIG. 4C, a cross-section view taken along the b-b' line of FIG. 4A displays the nMOS device. Thus, FIGS. 4A-4C may be alternately referenced for an understanding of the architecture of CMOS device 400 after completion of the gate replacement process depicted in FIG. 3A-3G.

As can be seen from FIGS. 4A, 4B, and 4C a low resistivity metal cap 470 is encompassed by p-metal 450. In FIG. 4B, a cross-section of the pMOS device shows the cross sectional area of metal cap 470 between gate isolation spacers 408 to be maximized for a given gate length over channel 415 between tip regions 410 of source/drains 412 because p-metal 450 is capable of providing a diffusion barrier between the metal cap 470 and gate dielectric 404 so that no additional barrier film is required.

Similarly, in FIG. 4C, the nMOS device gate electrode stack comprises p-metal 450 between the metal cap 470 and n-metal 435. Here again, in an embodiment of the present invention employing a metal carbonitride p-metal 450 providing a diffusion barrier in the nMOS device without need of a distinct layer for reducing outdiffusion of the metal cap 470 into the nMOS junction. Thus, in such embodiments, the cross sectional area of cap metal 470 between gate isolation spacers 408 is maximized for a given length of channel 420 between tip regions 425 of source/drains 427.

Although the present invention has been described in language specific to structural features and/or methodological acts, it is to be understood that the invention defined in the appended claims is not necessarily limited to the specific features or acts described. The specific features and acts disclosed are instead to be understood as particularly graceful implementations of the claimed invention useful for illustrating the present invention.

What is claimed is:

1. A method of forming a CMOS device comprising:
    forming a nMOS work function metal on a gate dielectric in a first region of a substrate;
    forming a pMOS work function metal on the gate dielectric in a second region of the substrate and on the nMOS work function metal, wherein the pMOS work function metal is a metal carbonitride comprising tantalum and has a work function of at least 4.8 eV;
    forming a metal cap on the metal carbonitride, wherein the metal cap is one or a combination of metals selected from the group consisting of silver, copper, aluminum and tungsten.

2. The method of claim 1, wherein forming the metal carbonitride comprises:
    placing the substrate into a reaction chamber;
    pulsing an organometallic precursor into the reaction chamber;
    pulsing nitrogen into the reaction chamber; and
    pulsing a plasma into the reaction chamber, wherein the organometallic precursor,
    the nitrogen, and the plasma react at the surface of the substrate to form a metal, carbon, and nitrogen containing layer on the gate dielectric and on the NMOS work function metal.

3. The method of claim 2, wherein the organometallic precursor comprises tantalum (Ta), hydrogen (H), and cyclopentadienyl (Cp).

4. The method of claim 3, wherein the organometallic precursor comprises $Cp_2TaH_3$.

5. The method of claim 2, wherein the plasma comprises at least one of hydrogen, argon and helium.

6. The method of claim 2, wherein the nitrogen gas may be introduced both with and without the plasma such that some pulses contain the nitrogen gas alone while other pulses contain both the nitrogen gas and plasma.

7. The method of claim 1, wherein forming the metal carbonitride comprises:
    forming a TaC layer on the substrate;
    exposing the TaC layer to a source gas comprising nitrogen while the TaC layer is heated to a temperature between 300° C. and 800° C. to form a TaCN layer from the TaC layer.

8. The method of claim 7, wherein exposing the TaC layer to a source gas comprising nitrogen further comprises providing a plasma of at least one of nitrogen, argon and helium.

9. The method of claim 1 wherein, forming the metal cap on the metal carbonitride further comprises:
plating copper on the metal carbonitride.

10. The method of claim 9, further comprising forming a copper seed on the metal carbonitride.

11. The method of claim 1, wherein the metal carbonitride comprises approximately 30 at. % tantalum.

12. The method of claim 11, wherein the metal carbonitride comprises 10-30 at. % carbon and 30-50 at % nitrogen.

13. The method of claim 12, wherein the metal carbonitride comprises, approximately 10 at. % carbon and approximately 50 at % nitrogen.

14. The method of claim 12, wherein the metal carbonitride comprises approximately 30 at. % carbon and approximately 30 at % nitrogen.

15. A method of forming a semiconductor device comprising:
forming a gate electrode placeholder over a substrate;
forming source/drain regions in the substrate and on either side of the gate electrode placeholder;
forming a dielectric layer over the gate electrode placeholder and substrate;
planarizing the dielectric layer to expose the gate electrode placeholder;
removing the gate electrode placeholder to form a trench in the dielectric layer and to expose a portion of the substrate;
forming a gate dielectric on the exposed portion of the substrate;
forming an NMOS work function metal in contact with a first region of the gate dielectric to form an NMOS transistor;
lining the trench with a metal carbonitride diffusion barrier, wherein the metal carbonitride diffusion barrier is in contact with a second region of the gate dielectric, contains approximately 30 at. % tantalum, 10-30 at. % carbon and 30-50 at % nitrogen, and has a work function of at least 4.8 eV to further form a PMOS work function metal of a PMOS transistor; and
filling the trench with a metal cap, wherein the metal cap is on the metal carbonitride diffusion baffler.

16. The method of claim 15, wherein the metal cap is one or a combination of metals selected from the group consisting of silver, copper, aluminum, and tungsten.

17. The method of claim 15, wherein lining the trench with a metal carbonitride diffusion barrier further comprises:
depositing the metal carbonitride with an organometallic precursor comprising
tantalum (Ta), hydrogen (H), and cyclopentadienyl (Cp) in the presence of a nitrogen containing precursor.

18. The method of claim 17, wherein the nitrogen containing precursor is selected from the group comprising $N_2$ and $NH_3$.

19. The method of claim 15, wherein the metal carbonitride comprises approximately 10 at. % carbon and approximately 50 at % nitrogen.

20. The method of claim 15, wherein the metal carbonitride comprises approximately 30 at. % carbon and approximately 30 at % nitrogen.

* * * * *

UNITED STATES PATENT AND TRADEMARK OFFICE
CERTIFICATE OF CORRECTION

| | | |
|---|---|---|
| PATENT NO. | : 7,682,891 B2 | Page 1 of 1 |
| APPLICATION NO. | : 11/647893 | |
| DATED | : March 23, 2010 | |
| INVENTOR(S) | : Lavoie et al. | |

It is certified that error appears in the above-identified patent and that said Letters Patent is hereby corrected as shown below:

In column 14, at line 12 delete, "baffler" and insert --barrier--.

Signed and Sealed this
Fifteenth Day of March, 2011

David J. Kappos
*Director of the United States Patent and Trademark Office*